United States Patent [19]

Edwards et al.

[11] 3,962,779

[45] June 15, 1976

[54] METHOD FOR FABRICATING OXIDE ISOLATED INTEGRATED CIRCUITS

[75] Inventors: Roger Edwards, Gillette; William Joshua Evans; Wesley Norman Grant, both of Berkeley Heights; Bernard Thomas Murphy, New Providence, all of N.J.

[73] Assignee: Bell Telephone Laboratories, Incorporated, Murray Hill, N.J.

[22] Filed: Dec. 23, 1974

[21] Appl. No.: 535,445

Related U.S. Application Data

[63] Continuation-in-part of Ser. No. 432,896, Jan. 14, 1974, abandoned.

[52] U.S. Cl. .................................. 29/577; 29/578; 29/576 W; 357/52
[51] Int. Cl.² .......................................... B01J 17/00
[58] Field of Search ... 29/576 IW, 578, 577; 357/50, 357/52

[56] References Cited
UNITED STATES PATENTS

| | | | |
|---|---|---|---|
| 3,237,271 | 3/1966 | Arnold | 29/578 |
| 3,534,234 | 10/1970 | Clevenger | 357/50 |
| 3,648,125 | 3/1972 | Peltzer | 357/52 |
| 3,758,943 | 9/1973 | Shibata | 29/578 |

*Primary Examiner*—W. Tupman
*Attorney, Agent, or Firm*—P. Abolins; L. C. Canepa; A. J. Torsiglieri

[57] ABSTRACT

A method of making an oxide isolated integrated circuit structure is simplified by forming a first level metallization pattern without the conventional underlying insulating layer and without the need for restricting the size of the metallization to the size of the semiconductor regions to be contacted. Portions of the first level metallization pattern can extend on the oxide isolation region to contact two otherwise isolated semiconductor zones. Additionally, subsequent to the formation of the oxide isolation regions and the first level metallization, an intermediate dielectric masking pattern is formed so the combination of the first level metallization, the oxide isolation regions and the masking pattern defines zones for the introduction of impurities. Further, the masking pattern alone is used to provide contact holes for a subsequently formed second level metallization pattern.

3 Claims, 6 Drawing Figures

METHOD FOR FABRICATING OXIDE ISOLATED INTEGRATED CIRCUITS

CROSS REFERENCE TO RELATED APPLICATION

This application is a continuation-in-part of our co-pending application Ser. No. 432,896 filed on Jan. 14, 1974, now abandoned.

BACKGROUND OF THE INVENTION

This invention relates to the fabrication of semiconductor devices; and, more particularly, to a method of making an oxide isolated integrated circuit structure with greater ease, resulting partially from improved formation of both metallization patterns and impurity zones.

In the manufacture of the oxide isolated integrated circuits, a reduction of the number of masking steps required and a reduction in the criticality of the tolerances required in the masking steps are desirable goals. In particular, this is true of both forming the semiconductor zones and forming two-level metallization patterns which contact the semiconductor zones.

Oxide isolated integrated circuits can be fabricated in accordance with U.S. Pat. No. 3,648,125 issued to D. L. Peltzer on March 7, 1972 which teaches fabrication of impurity zones of an oxide isolated integrated circuit and a subsequent formation of a metallization pattern. Before the formation of the metallization pattern an insulating layer, requiring a masking step, is selectively formed to provide contact holes and to insulate the metallization pattern from impurity zones adjacent the impurity zone to be contacted. It would be desirable to eliminate this masking step.

Furthermore, although forming a second level metallization pattern is not taught in the Peltzer patent, such a pattern is desirable in some applications. Certain known methods of forming two levels of metallization include the steps of selectively forming a first underlying insulating layer to provide contact holes for the first level metallization, forming the first level metallization, forming partially over the first level metallization a second insulating layer having contact holes for the second level metallization, and then forming the second level metallization.

To simplify fabrication, it would be desirable to form a first level metallization pattern without an underlying insulating layer. Elimination of the underlying insulating layer would, of course, eliminate the masking step needed to form contact holes in the layer. Further, it would be desirable to form subsequently both a pattern of impurity zones and a pattern of contact holes for a second level metallization without a separate masking step for each pattern. Additionally, it would be desirable not to limit the size of both the first and second metallization patterns by the size of the impurity zone to be contacted.

SUMMARY OF THE INVENTION

To these and other ends, fabrication of semiconductor integrated circuit structures in accordance with an embodiment of this invention includes the steps of forming oxide isolation regions in a semiconductor body and forming a first level metallization pattern on semiconductor zones to be contacted and on adjacent oxide isolation regions. Processing is thereby simplified by omitting the usual insulating layer under the first level metallization pattern and the masking step for forming contact openings through this layer. Further, the invention recognizes that by forming the metallization pattern over the adjacent oxide isolation region as well as the semiconductor zone to be contacted, the pattern can be made larger and the masking need not be as critical as when the pattern is formed only on the semiconductor zone. Additionally, the metallization pattern can extend over the oxide isolation region to contact another semiconductor zone.

Further, in accordance with an embodiment of this invention and subsequent to the formation of the first level metallization pattern, there is formed an intermediate dielectric masking pattern having openings so the combination of the first level metallization pattern, the oxide isolation regions and the masking pattern defines the boundaries of a semiconductor zone for impurity introduction.

In addition to exposing semiconductor zones for impurity introduction, the openings in the masking pattern alone also expose portions of the first level metallization pattern which are to be contacted by a subsequently formed second level metallization pattern. Therefore, also in accordance with an embodiment of this invention, after introducing impurities to form the impurity zones, a second level metallization pattern is formed to contact the impurity zones and such portions of the first level metallization which have been left exposed.

As a result, one masking step is used to form the openings through the intermediate dielectric masking pattern and thereby partially define the impurity zones and completely define the contact holes for the second level metallization pattern.

DETAILED DESCRIPTION

Figure 1A:
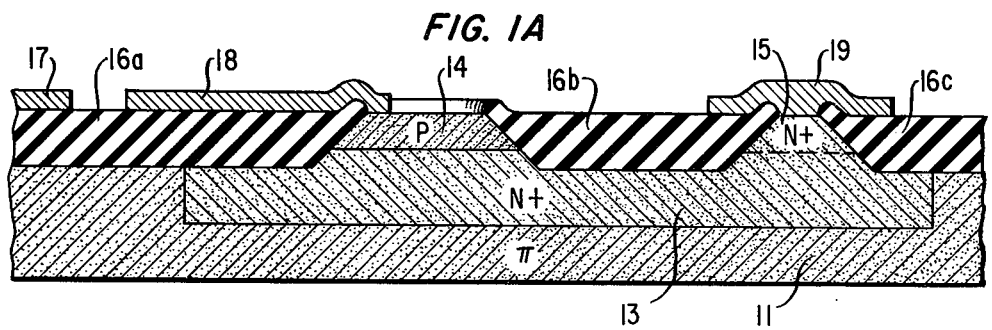
FIGS. 1A, 2A and 3A show a cross-section of a semiconductor wafer as it appears after successive processing steps performed on the semiconductor wafer in accordance with an embodiment of this invention.

Referring to FIG. 1A, fabrication in accordance with an embodiment of this invention begins with a monocrystalline silicon substrate 11 which may be a portion of a slice having P-type conductivity, designated $\pi$, produced by boron impurity introduction to have a substantially uniform impurity concentration of about $10^{15}$ per cubic centimeter. Additionally, although any orientation of the silicon can be chosen, either (100) or (110) is preferred to permit anisotropic etching of the silicon. Such etching is advantageous because it produces openings with sloping sidewalls thereby reducing the height of an oxide ridge which forms when oxide is grown in the opening. Such sloping sidewalls are not obtained if (111) orientation silicon is used.

An impurity zone 13, also shown in FIG. 1A, is formed by introducing into substrate 11, N-type impurities such as, for example, arsenic or antimony. Typically, zone 13 has a sheet resistivity of about 20 ohms per square, a surface impurity concentration of about $10^{19}$ per cubic centimeter, and is formed by diffusion of impurities to a depth of about 4 microns from the surface of substrate 11. Zone 13 can be used as the collector zone of a later formed transistor.

Subsequently, a P-type epitaxial layer 14 is formed on substrate 11 and zone 13. Layer 14 has a typical impurity concentration of about $10^{17}$ per cubic centimeter and a typical thickness is about 1.7 microns. An N-type impurity zone 15 can be formed through epitaxial layer 14 to contact impurity zone 13. If desired, zone 15 can be formed subsequent to the formation of an oxide isolation region described below. Typically, zone 15, denoted a deep collector contact, is formed by a phosphorous diffusion and has an impurity concentration of about $5 \times 10^{17}$ per cubic centimeter. Alternatively, impurities can be introduced by ion implantation or thermal predeposition into only the upper portions of zone 15 and then diffused to their final depth during subsequent heating steps.

Then, oxide isolation regions 16a, 16b and 16c are formed to provide lateral electrical isolation of the integrated circuit. In particular, a portion of epitaxial layer 14 is isolated as shown in FIG. 1A. The portion can be used as the base region of a later formed transistor. Appropriate techniques for forming oxide isolation regions are described in U.S. Pat. No. 3,648,125 issued to D. L. Peltzer. More specifically, in accordance with this embodiment of the invention, an anisotropic etch is used to form openings through the epitaxial layer 14. The use of an anisotropic etch produces sloping sidewalls in the openings. In particular, a (100) oriented silicon sample can be etched to form (111) sidewalls at approximately 55° to the bottom wall; a (110) oriented silicon sample can be etched to form one pair of (111) sidewalls at approximately 35° to the bottom wall. After etching, an oxide is grown in the opening. Oxide growth occurs both on the sloping sidewall and on the bottom wall. Accordingly, there is a slight ridge around the perimeter of the opening as shown in FIG. 1A.

However, if an isotropic etch had been used in a (111) oriented silicon sample, the conventional or standard orientation, a ridge of greater proportions would be formed. That is, the combination of oxide growth from a vertical sidewall and the bottom wall forms a more pronounced oxide ridge and places the oxide itself in severe compressive stress. The presence of the more pronounced ridge is disadvantageous because it tends to produce discontinuities in metallization formed over the ridge.

Continuing with the fabrication steps in accordance with this embodiment of the invention, first level metallizations 17, 18 and 19, shown in FIG. 1A, are formed on the oxide regions 16a, 16b and 16c and the impurity zones 14 and 15. Examples of metallization materials are aluminum, gold, silicon and tungsten. Typically, a tungsten metallization would be about 0.6 micron thick and a silicon metallization about 1.0 micron thick. It can be seen in FIG. 1A that metallization 18 makes advantageous use of oxide region 16a adjacent to impurity zone 14. That is, metallization 18 is not limited in lateral extent by the size of impurity zone 14 since it can also extend over oxide region 16a. Indeed, the bulk of metallization 18 can be formed on oxide region 16a with only enough of metallization 18 on impurity zone 14 to provide electrical connection.

Figure 1B:
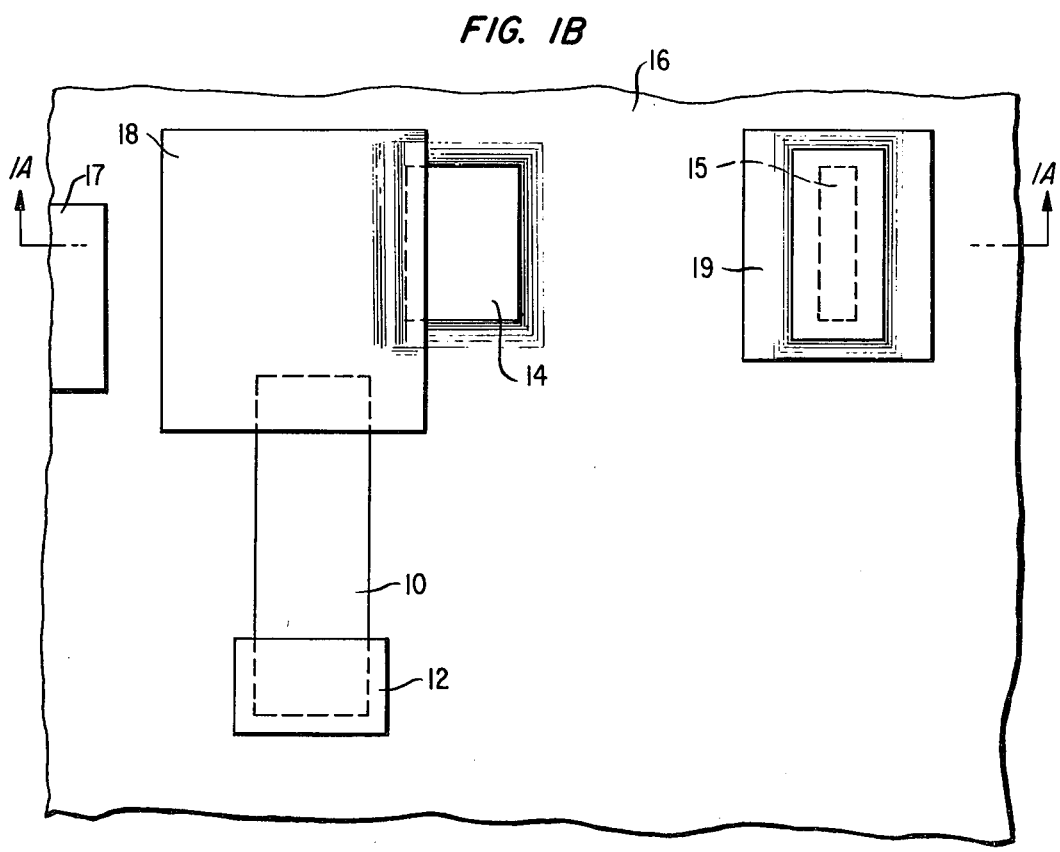
FIGS. 1B, 2B and 3B show a plan view of the semiconductor wafer structure shown in FIGS. 1A, 2A and 3A, respectively.

Metallizations 17, 18 and 19 can also be seen in FIG. 1B which shows a plan view of the wafer structure whose cross section is shown in FIG. 1A. FIG. 1B also shows that oxide regions 16a, 16b and 16c are connected together and are accordingly designated oxide region 16. Further, the locations of impurity regions 14 and 15 are also shown in FIG. 1B. Still further, a P-type impurity zone 10 and a metallization 12 are shown in FIG. 1B. Impurity zone 10 is part of the epitaxial layer, located on N-type zone 13 and laterally surrounded by oxide region 16. Zone 10 is conductively connected at one end to base zone 14 by metallization 18. Metallization 12 provides a contact to the other end of impurity zone 10.

An additional masking step and impurity introduction can be used to change the impurity concentration of zone 10 from that of the remaining epitaxial layer. For example, zone 10 can be used as a resistor and can have a higher concentration of P-type impurities than impurity zone 14. Further, impurities can be introduced into a portion of zone 14 directly contacted by metallization 18 to improve ohmic contact.

Figure 2A:
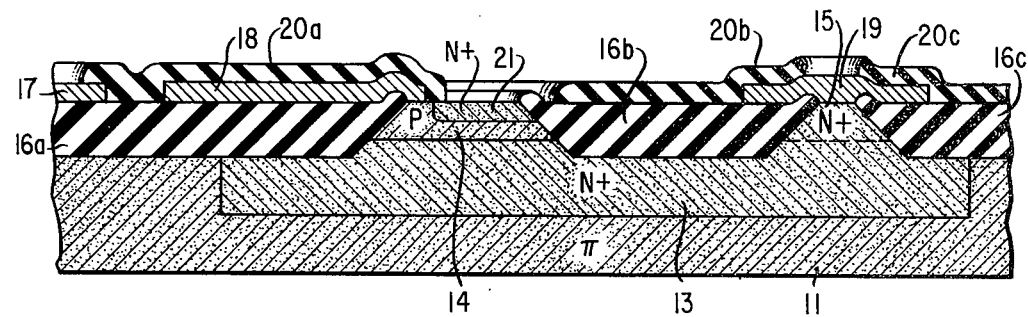
Figure 2B:
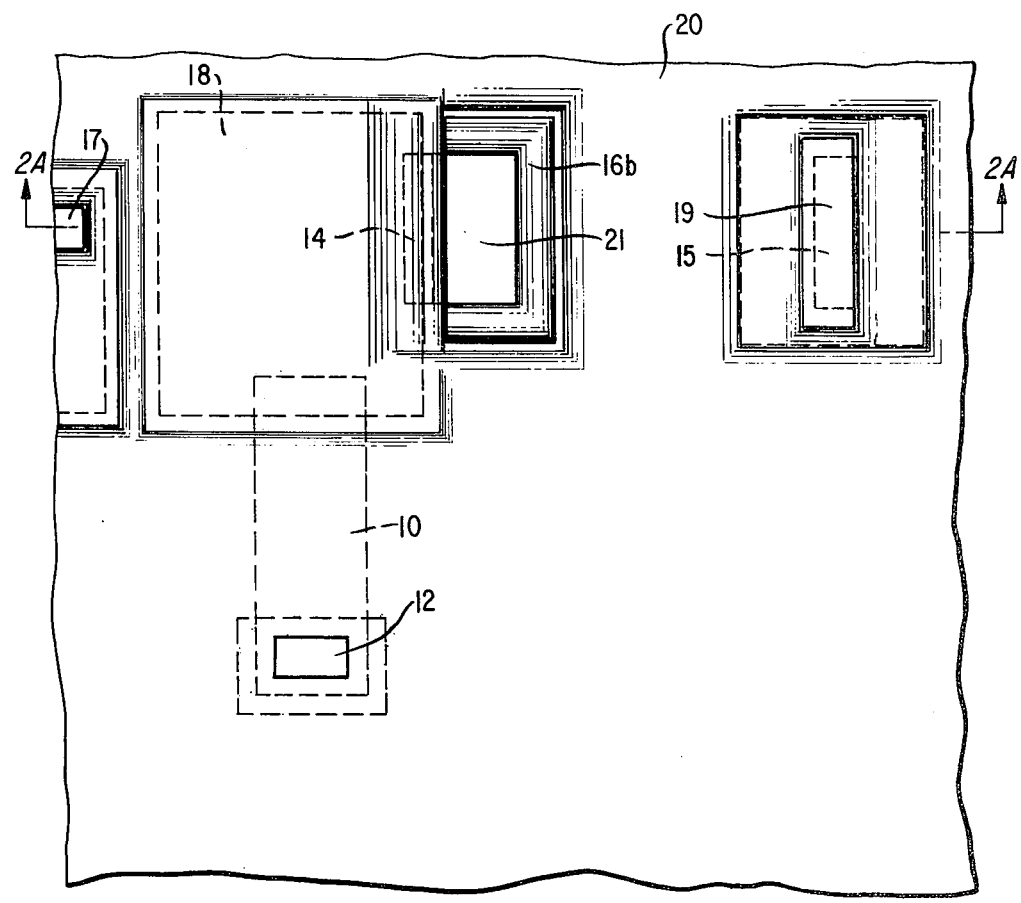

FIG. 2B shows the plan view of the semiconductor wafer shown in FIGS. 1A and 1B after additional processing steps. More specifically, an intermediate dielectric masking pattern 20 and an impurity zone 21 of N-type impurities have been formed. In this particular embodiment, masking pattern 20 is formed by first forming a layer, such as, for example, a composite of silicon nitride and silicon oxide, on the surface of the structure shown in FIGS. 1A and 1B and then selectively etching to form openings through the layer. The combination of masking pattern 20, the first level metallization pattern and the oxide isolation region 16 defines an opening through which impurities are introduced to form impurity zone 21. More specifically, the boundaries of the opening are defined by masking pattern 20 and region 16. Impurity zone 15 is protected from further impurity introduction by first level metallization 19. Similarly, portions of impurity zone 10 not under masking pattern 20 are protected by first level metallization 12. Accordingly, in addition to exposing impurity zone 21, openings defined by masking pattern 20 expose portions of metallization 12, 17 and 19 for subsequent connection to a second level metallization pattern.

As is well known, introduction of impurities through an opening creates an impurity zone which is substantially only beneath the opening. Some lateral diffusion of impurities may take place. The degree of this lateral diffusion is related to the depth of the diffusion and is usually less than the depth. Techniques to reduce lateral diffusion include choosing certain crystallographic orientations for the substrate and introducing impurities by ion implantation. If the depth of impurity zone 21 is 0.3 microns, then the lateral diffusion is substantially different from a typical mask registration tolerance which is about 2 to 3 microns. That is, the boundaries of impurity zone 21 remain substantially coincident with the boundary of the opening. In contrast, the boundaries of an opening formed after formation of the impurity zone may not be substantially coincident with the boundaries of the impurity zone.

FIG. 2B also shows the relative position of metallization 18, impurity zone 10, impurity zone 14 and impurity zone 15. Cross section 2A of the wafer shown in FIG. 2B is shown as FIG. 2A. Accordingly, a cross section of impurity zone 21 appears in FIG. 2A and a cross section of masking pattern 20 of FIG. 2B appears in FIG. 2A as regions 20a, 20b and 20c.

The method of introducing impurities to form impurity zone 21 is related to the material chosen for the first level metallization pattern which, of course, is part of the combination that defines the boundaries of impurity zone 21. That is, if the material of the first level metallization can withstand high temperatures, a diffusion can be used to form impurity zone 21. Examples of such materials include refractory metals, such as tungsten, or semiconductors, such as silicon. Alternatively, if the material of the first level metallization pattern cannot withstand high diffusion temperatures, for example, aluminum, the impurity zone 21 can be formed using ion implantation followed by a suitably low temperature anneal. A typical impurity zone 21 can be formed by introducing arsenic impurities to a depth of about 0.3 microns and with a surface impurity concentration of about $10^{19}$ per cubic centimeter giving a sheet resistivity of about 20 ohms per square.

As already stated, in addition to partially defining semiconductor zone 21, openings defined by masking pattern 20 also expose those portions of the first level metallization which are to be contacted by a second level metallization. In this particular embodiment, such openings can be seen in FIG. 2A above metallizations 17 and 19. Also, such an opening is shown above metallization 12 in FIG. 2B. It can also be seen that the masking to provide these openings need not be critical because of the relative size of the first level metallization. That is the openings can be larger than the zones being contacted. Further, it is not necessary to form an additional underlying mask to form contact holes for the second level of metallization. Reducing the number of masking steps tends to improve the production yield.

Figure 3A:
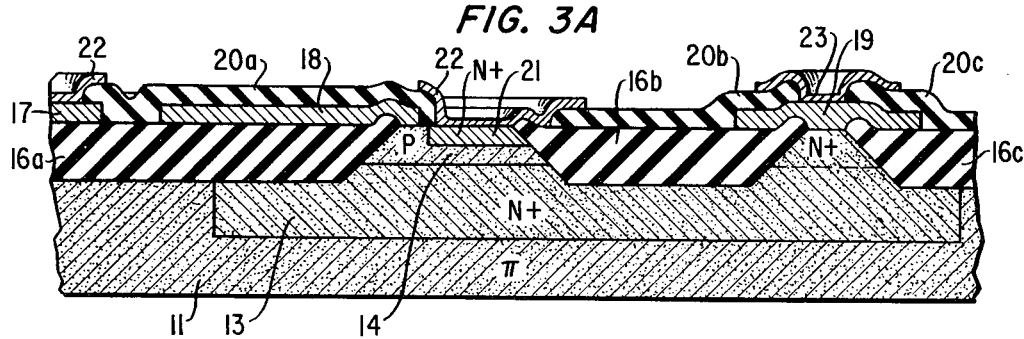
Figure 3B:
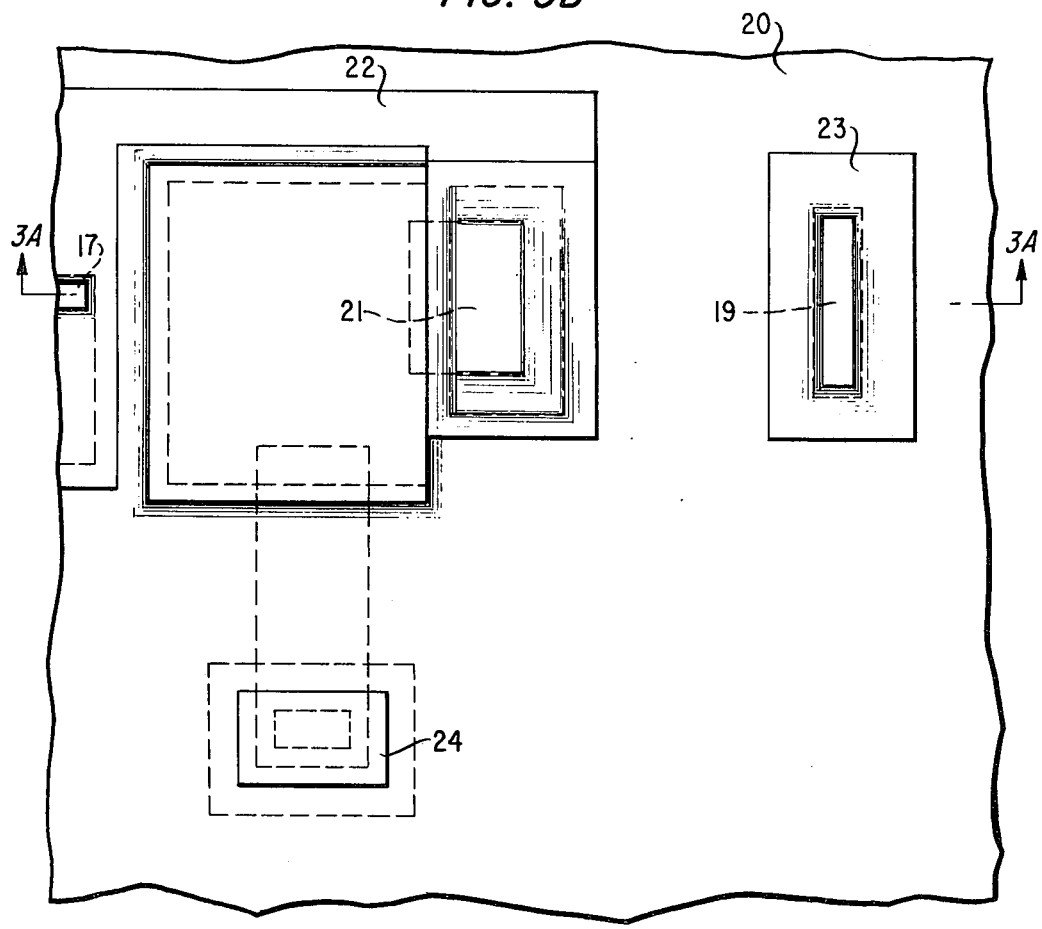

The second level metallization pattern is shown in FIG. 3B as regions 22, 23 and 24. Cross section 3A of FIG. 3B is shown in FIG. 3A which therefore also shows cross sections of regions 22 and 23.

Various other modifications and variations will no doubt occur to those skilled in the various arts to which this invention pertains. For example, the steps of forming the buried collector zone and epitaxial layer may be modified or omitted. Semiconductors other than silicon can also be used.

What is claimed is:

1. A method for fabricating a semiconductive integrated circuit comprising the steps of
preparing a semiconductive element which includes on one surface a plurality of semiconductive regions which are separated at such surface by dielectric isolation regions,
forming directly on said surface a first metallization pattern,
depositing an insulating layer over said surface including the first metallization pattern,
forming openings in the insulating layer for exposing at least one portion of said first metallization pattern and a portion of at least one semiconductive region,
introducing impurities into the exposed portions of said semiconductive region for affecting their conductivities,
and forming over said surface, including the first metallization pattern and the insulating layer, a second metallization pattern without reforming the openings in said insulating layer,
said second metallization pattern making electrical connection to the exposed portions of the semiconductive regions and of the first metallization pattern through the openings in the insulating layer.

2. A method for fabricating a semiconductive integrated circuit comprising the steps of
preparing a semiconductive element which includes on one surface a plurality of semiconductive regions which are separated at said surface by dielectric isolation regions,
forming on said surface a first metallization pattern comprising a plurality of discrete conductive segments, at least one of which overlies and is contiguous with both dielectric and semiconductive regions,
depositing an insulating layer over said surface including the first metallization pattern,
forming openings in the insulating layer for exposing a portion of said conductive segments and a portion of at least one semiconductive region,
introducing impurities into the exposed portions of said semiconductive regions for affecting their conductivities,
and forming over said surface, including the first metallization pattern and the insulating layer, a second metallization pattern comprising a plurality of conductive segments at least one of which contacts the exposed portion of a semiconductive region and at least one of which contacts an exposed conductive segment of the first metallization pattern.

3. The method of claim 2 in which the first metallization pattern includes at least one conductive segment which interconnects two semiconductive regions separated by a dielectric isolation region.

* * * * *